United States Patent
Tusler et al.

[11] Patent Number: 5,814,762
[45] Date of Patent: Sep. 29, 1998

[54] GROUNDING FOR ENCLOSURES

[75] Inventors: Ralph Michael Tusler, Monument; Mark S. Lewis; Reuben Martinez, both of Colorado Springs, all of Colo.

[73] Assignee: Digital Equipment Corporation, Maynard, Mass.

[21] Appl. No.: 687,306

[22] Filed: Jul. 25, 1996

Related U.S. Application Data

[63] Continuation of Ser. No. 422,408, Apr. 12, 1995, abandoned.

[51] Int. Cl.$^6$ ..................................................... H05K 9/00
[52] U.S. Cl. ........................ 174/35 R; 174/52.1; 361/816
[58] Field of Search ............................. 174/35 R, 35 C, 174/35 MS, 51, 265, 266, 52.1; 361/799, 800, 816, 818, 753; 439/387, 426, 444

[56] References Cited

U.S. PATENT DOCUMENTS

| | | | |
|---|---|---|---|
| 3,366,918 | 1/1968 | Johnson et al. | 174/35 GC |
| 4,948,923 | 8/1990 | Suzuui | 174/35 R |
| 5,043,848 | 8/1991 | Rogers et al. | 174/35 R |
| 5,175,395 | 12/1992 | Moore | 174/35 R |
| 5,239,127 | 8/1993 | Swiule et al. | 174/35 R |
| 5,365,410 | 11/1994 | Lonua | 361/816 |
| 5,373,101 | 12/1994 | Barabolau | 174/35 R |
| 5,459,640 | 10/1995 | Moutrie et al. | 361/707 |

Primary Examiner—Kristine L. Kincaid
Assistant Examiner—Kristina Soderquist
Attorney, Agent, or Firm—Mary M. Steubing; A. Sidney Johnston; Michael A. Rodriguez

[57] ABSTRACT

An apparatus is provided to reduce the amount of EMI generated by a circuit. The grounding of an enclosure is improved by providing a number of shaped protuberances, the protuberances having an end that penetrates a conductive region of a circuit board, such that when the circuit board is mounted to the support member, the protuberances make a penetrating electrical contact and provides for additional ground paths, thereby reducing the EMI generated by the assembly.

17 Claims, 5 Drawing Sheets

GROUNDING FOR ENCLOSURES

This application is a continuation, of application Ser. No. 08/422,408, filed Apr. 12, 1995, now abandoned.

BACKGROUND OF THE INVENTION

This invention relates generally to grounding connections and more specifically to providing additional grounding paths in electronic assemblies in order to reduce Electro-Magnetic Interference (EMI) emissions.

As it is known in the art, any piece of equipment carrying an electric current is a possible source of EMI. Electronic devices may experience operating difficulties when subjected to EMI. In order to make electronic devices reliable and compliant with various standards it is desirable to reduce EMI to a minimum.

EMI can be viewed as any electromagnetic disturbance which results in the malfunctioning of an electronic device or interference to an electronic device. This disturbance may occur in three different ways namely through interference generation, interference transmission or interference susceptibility. EMI is generated by varying electric or magnetic fields. The more abrupt the variation in energy flow the broader the frequency range of the generated interference. Potential sources of interference are switches, relays, motors and transmitters. Once the interference is generated it may be transmitted from the source to an electronic device by free space radiation, inductive or magnetic coupling, capacitive or electric field coupling, a common conductive or capacitive impedance, or any combination thereof. Susceptible electronic devices may be exposed to the generated interference by conductors to the device.

As an example if a circuit board was mounted to a support member, with mounting screws every 3 inches, there would be a series of three inch zero gap width antennas radiating EMI. In order to reduce this one could use additional mounting holes and screws, but this costs valuable space and requires additional hardware and assembly time.

One attempt to reduce EMI has been to add a series of bumps to a circuit board mounting frame which creates ground connections with a circuit board when the circuit board is mounted in the system. This attempt to reduce EMI suffers from the bump/circuit board connection becoming unreliable over time due to oxidation of the connection surfaces.

SUMMARY OF THE INVENTION

In accordance with the present invention an improved grounding scheme includes a number of specially shaped grounding elements extending from an electrically conductive support member. The specially shaped grounding elements feature a shape having an end portion that penetrates a conductive area of a circuit board, thus providing additional grounding points via the grounding element/circuit board assembly connections. With such an arrangement, the grounding of the circuit is improved and the amount of EMI transmitted is reduced.

One way to reduce the amount of EMI generated by an electronic assembly is to provide additional ground paths. When a circuit board is mounted against a support member, the resulting zero width gap between the circuit board and the member acts as an antennae, especially at higher frequencies, such as those in the range of one gigahertz. By adding additional grounding elements, the length of the resulting zero gap width between the circuit board and the support member are reduced thereby resulting in reduced EMI emissions. By using additional grounding elements, the mounting holes and screws can still be used every three inches, but can then use the additional grounding elements every inch between the mounting holes, thereby reducing the length of the zero width gap antennas from three inches to one inch, and thus reduce the amount of EMI transmitted. As a result the enclosure becomes compliant with various standards, and electronic devices no longer experience operating difficulties caused by EMI emission. By making a penetrating connection, the problem of oxidation of the connection surfaces is overcome.

DESCRIPTION OF THE PREFERRED EMBODIMENT

Figure 1:
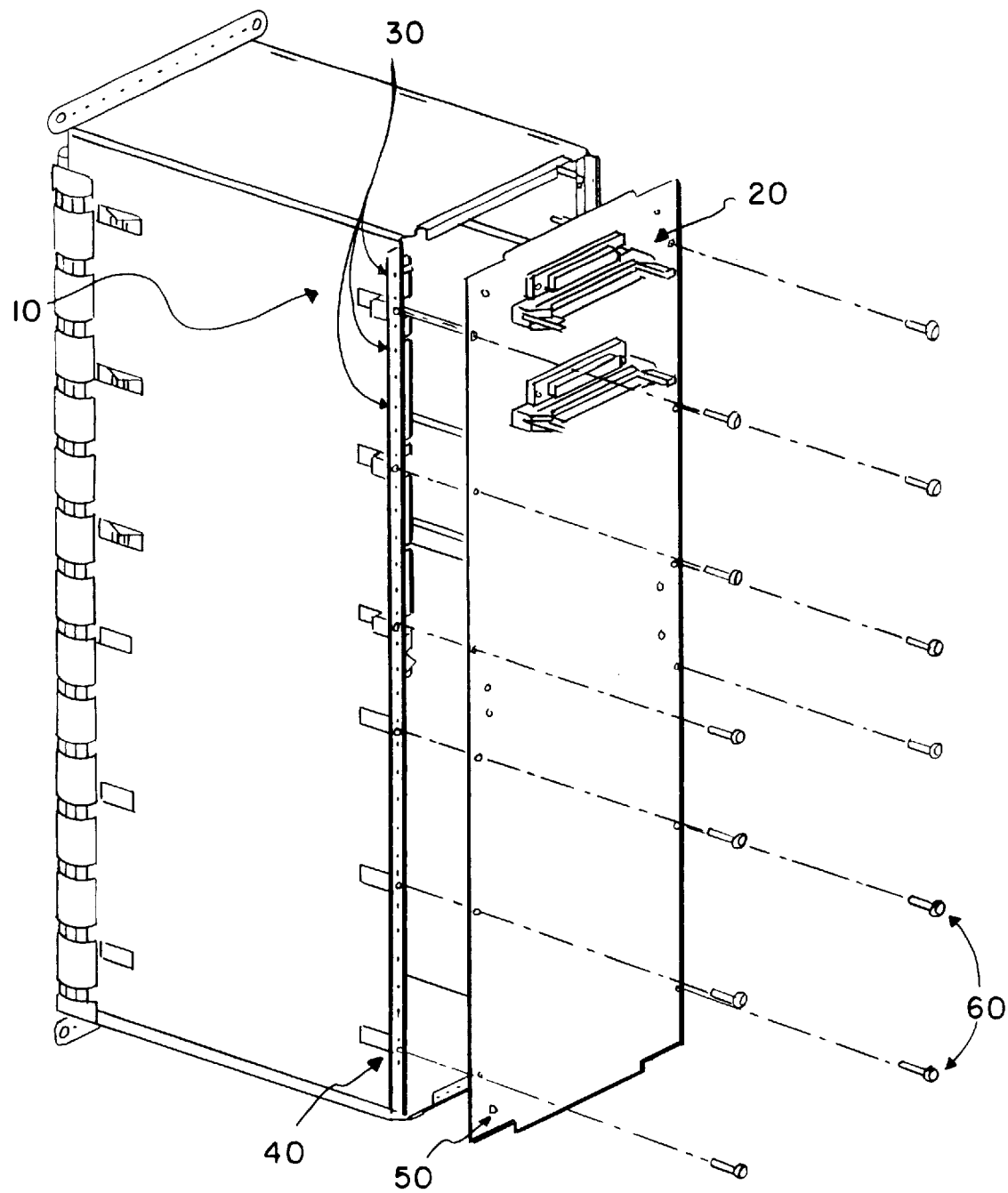
FIG. 1 is an exploded view of a backplane/system enclosure featuring a series of grounding elements which make penetrating electrical connections to the backplane.
Figure 2:
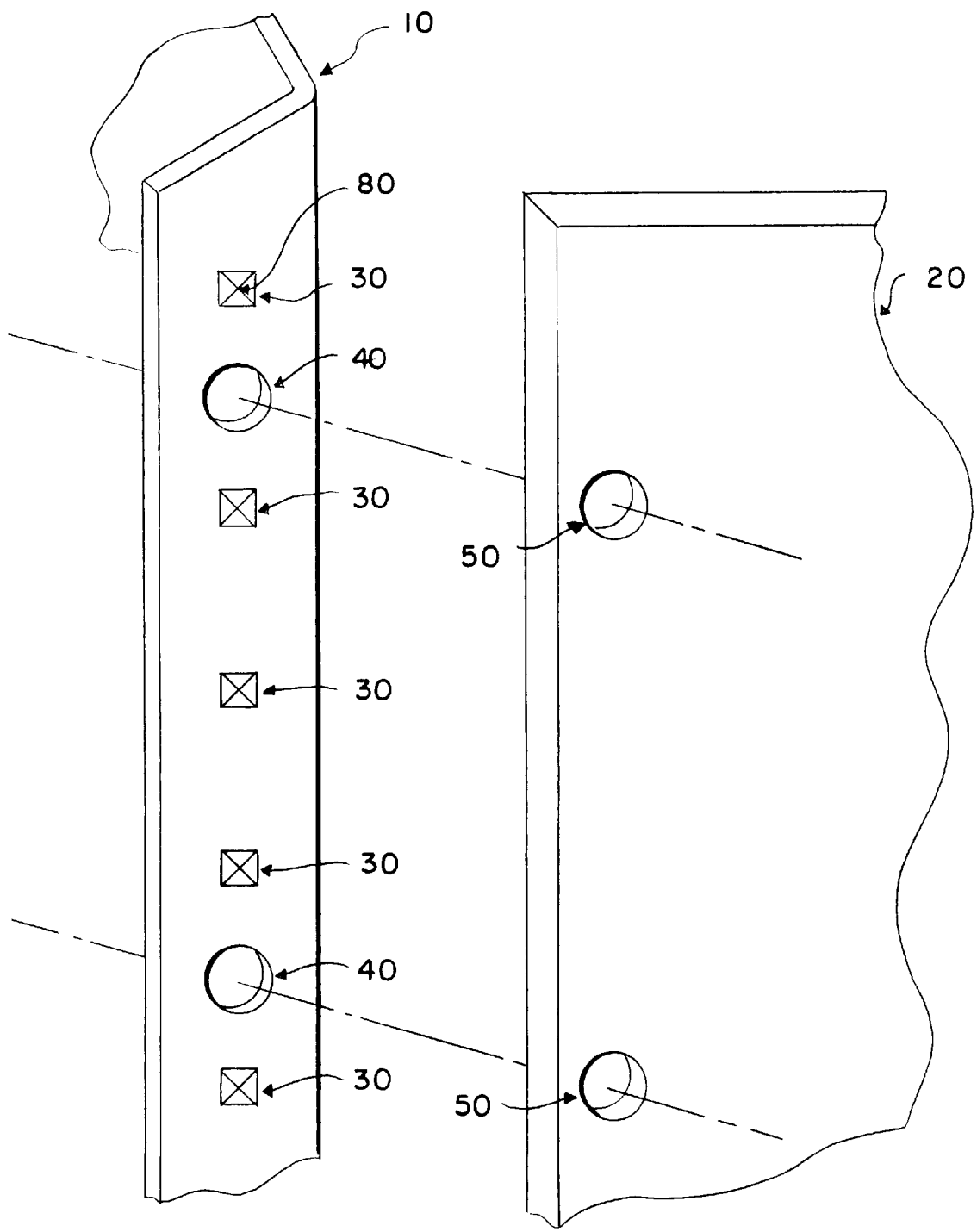
FIG. 2 is an exploded view of an electrically conductive support member having a series of grounding elements which make penetrating electrical connections to a circuit board.
Figure 3:
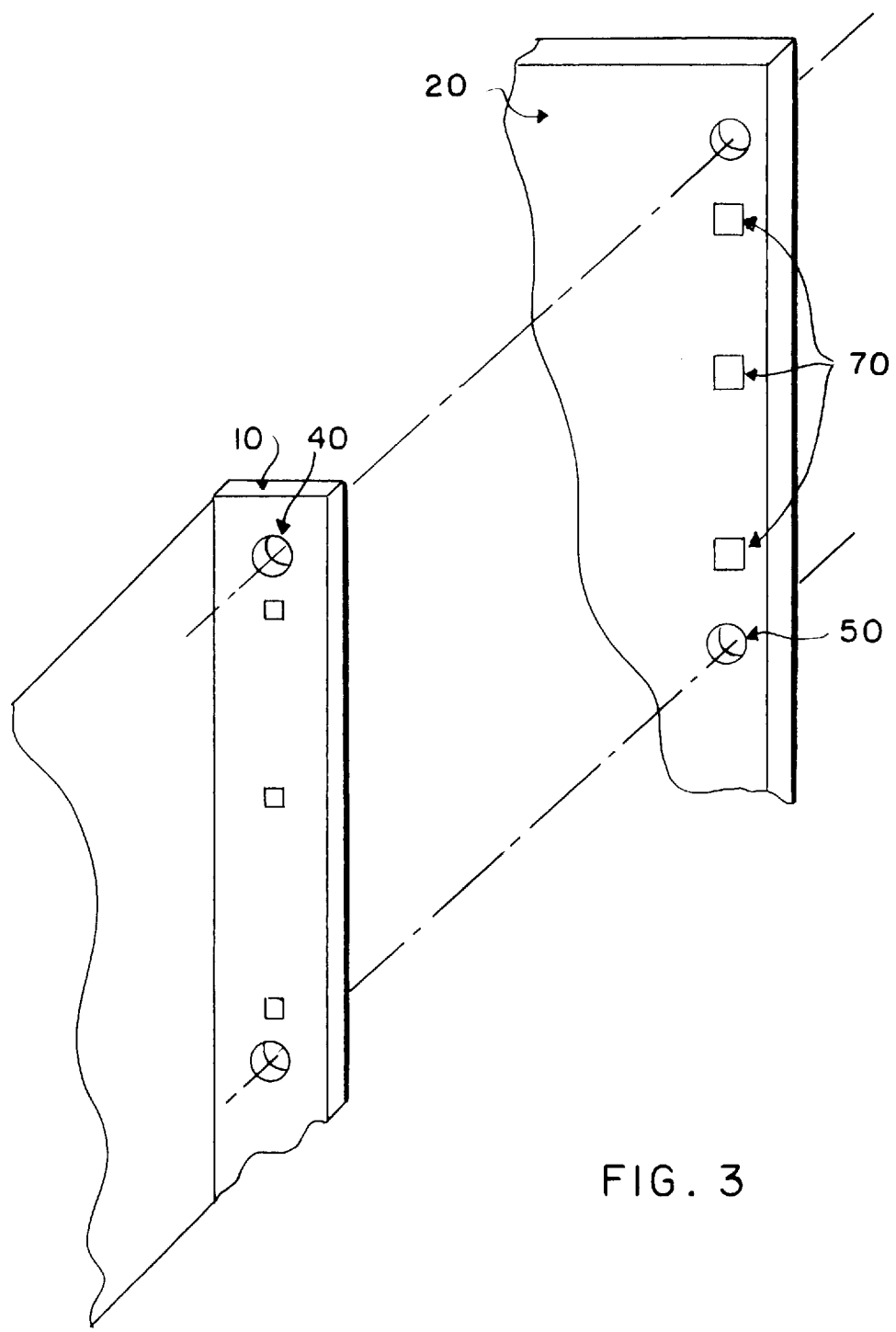
FIG. 3 is an exploded rear view of an electrically conductive support member having a series of grounding elements which make penetrating electrical connections to a circuit board in accordance with the principles of the invention.

Referring now to FIGS. 1, 2 and 3 a conductive support member 10 is shown having a series of mounting holes 40 and a series of grounding elements 30. In this embodiment the grounding elements 30 are integrally formed portions of the support member 10. Additionally, the grounding elements 30 could be individual pieces which are electrically connected to the support member 10 by welding, brazing, soldering, conductive epoxy or any other means that allows for an electrical connection between the support member 10 and the grounding elements 30.

Figure 5:
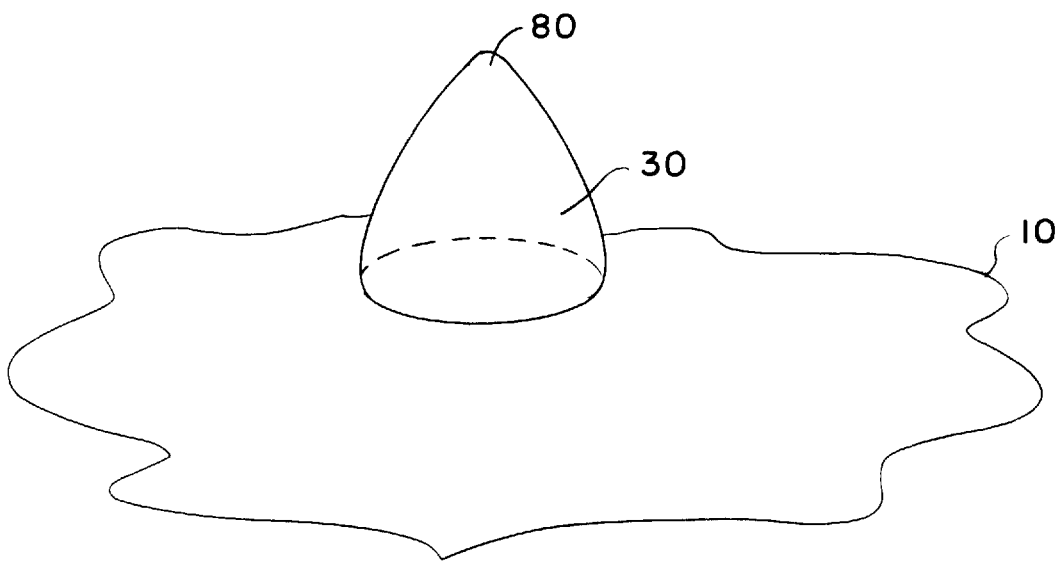
FIG. 5 is an alternative embodiment of a grounding element, which is shown as having a conical shape.

The grounding elements 30 shown in the figures are pyramid shaped with a terminating region that is pointed, though they could also be conically shaped, as shown in FIG. 5, or any other shape effective to penetrate a conductive surface region when brought into an electrical grounding relationship with the circuit board 20. As shown, the pyramid shaped grounding elements 30 are of a maximum height of 0.015 inches when measured from the apex of the pyramid to the base perpendicular to the surface of support member 10. This maximum height has been found advantageous for use in the present embodiment in order to avoid the risk of penetrating into additional layers of the circuit board 20, potentially causing short circuits. The grounding elements 30 have a height greater than or equal to 0.005 inches.

FIGS. 1, 2 and 3 show a circuit board 20 that has a conductive surface region 70 on the side closest to support member 10. Surface region 70 is a conductive pad connected to ground potential. Surface region 70 could be a series of ground pads or a single ground etch. Circuit board 20 also has a series of mounting holes 50 which align with the mounting holes 40 of support member 10. When circuit board 20 is mounted onto support member 10, the mounting holes of circuit board 20 are aligned with the mounting holes of support member 10. The circuit board 20 is attached to the support member 10 via screws 60. Nuts and bolts, rivets or any other attachment means which serve to bring circuit board 20 into contact with support member 10 can also be used.

Figure 4:
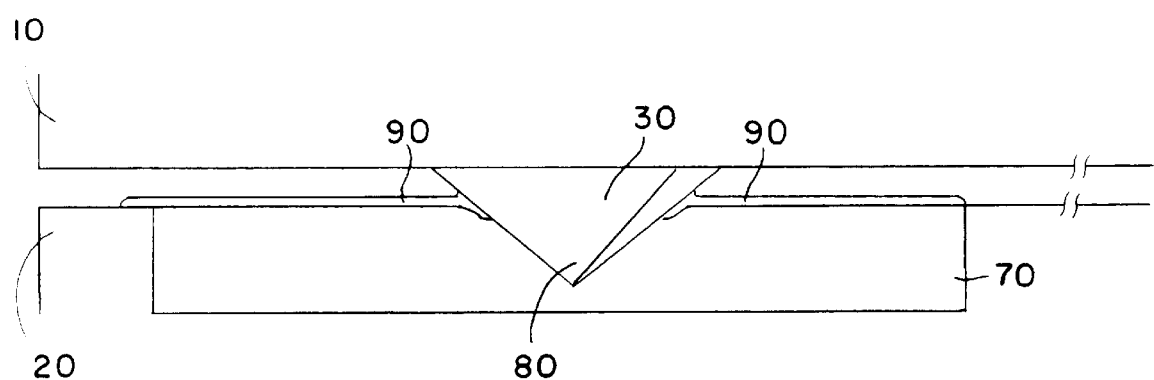
FIG. 4 is a top view of a grounding element penetrating an electrically conductive surface region on a circuit board through a non-conductive layer.

The grounding elements 30 are brought into electrical grounding relationship with the conductive surface region 70 of circuit board 20. When the grounding elements 30 are brought into the electrical grounding relationship, the terminating ends 80 of grounding elements 30 penetrate the conductive surface region 70 of circuit board 20. This penetration is sufficient to make an electrically conductive connection between grounding element 30 and conductive surface region 70 of circuit board 20, despite any oxides, masks or other material which would serve to insulate conductive surface region 70 of circuit board 20 from making an electrical connection with a grounding element 30. FIG. 4 shows a layer 90 of non-conductive material on the conductive surface region 70 of the circuit board 20. The vertex 80 of the grounding element 30 penetrates the layer 90 to establish the electrically conductive connection between the grounding element 30 and the electrically conductive surface region 70. With such an arrangement the amount of EMI transmitted is reduced to an acceptable level.

Having described preferred embodiments of the invention it will now become apparent to those of ordinary skill in the art that other embodiments incorporating these concepts may be used. accordingly it is submitted that the invention should not be limited to the described embodiments but rather should only be limited by the spirit and scope of the appended claims.

What is claimed is:

1. An enclosure, comprising;
   a circuit board with a surface having a solid electrically conductive surface region at the surface;
   an electrically conductive wall including an electrically conductive grounding element on a surface of the wall at an edge of the wall, the grounding element having sides, all such sides narrowing as the sides extend from the surface of the wall to terminate at a common vertex spaced from the surface of the wall; and
   a mechanism joining the wall at the edge to the circuit board with the vertex of the grounding element pressing against the solid electrically conductive surface region at the surface of the circuit board to penetrate the solid electrically conductive surface region and establish an electrically conductive relationship with the electrically conductive surface region, the path of penetration of the vertex of the grounding element extending in a direction perpendicular to the solid electrically conductive surface region at the surface of the circuit board.

2. The enclosure as recited in claim 1 wherein said grounding element is integrally formed from said surface of the wall.

3. The enclosure as recited in claim 1 wherein the vertex of the grounding element is spaced 0.015 inches from the surface of the wall.

4. The enclosure as recited in claim 1 wherein said grounding element has a pyramidal shape.

5. The enclosure according to claim 4 wherein the vertex is spaced between 0.005 and 0.015 inches, inclusive, from the surface of the wall.

6. The enclosure as recited in claim 1 wherein the vertex of the grounding element is spaced less than or equal to 0.015 inches from the surface of the wall, and the vertex of the grounding element is spaced greater than or equal to 0.005 inches from the surface of the wall.

7. The enclosure according to claim 1 wherein the circuit board is a second wall of the enclosure.

8. The enclosure according to claim 1 wherein the wall includes a flange at the edge of the wall and wherein the surface of the wall is on the flange.

9. The enclosure according to claim 8 wherein the mechanism joins the circuit board to the flange.

10. The enclosure according to claim 1 wherein the grounding element is soldered to the surface of the wall.

11. The enclosure according to claim 1 wherein the circuit board further includes a non-conductive film disposed on the surface of the circuit board over the electrically conductive surface region, arid wherein the vertex of the grounding element penetrates the non-conductive film to establish an electrically conductive relationship with the electrically conductive surface region.

12. The enclosure according to claim 1 wherein the circuit board and the wall each have a mounting hole, the mounting holes being aligned to each other, and wherein the mechanism includes a screw extending through the mounting holes.

13. An enclosure, comprising:
    a circuit board with a surface having an electrically conductive region and a non-conductive film disposed on the surface of the circuit board over the electrically conductive region;
    an electrically conductive wall including an electrically conductive grounding element on a surface of the wall at an edge of the wall, the grounding element having sides, all such sides narrowing as the sides extend from the surface of the wall to terminate at a common vertex spaced from the surface of the wall; and
    a mechanism joining the wall at the edge to the circuit board with the vertex of the grounding element penetrating the non-conductive film to establish an electrically conductive relationship with the electrically conductive region, the path of penetration of the vertex of the grounding element extending in a direction perpendicular to the surface of the circuit board.

14. An enclosure, comprising:
    a first surface having a solid electrically conductive surface region at the first surface; and
    a second surface including an electrically conductive protuberance on the second surface, the protuberance having sides, all such sides narrowing as the sides extend from the second surface to terminate at a vertex spaced apart from the second surface, the vertex of the protuberance pressing against the solid electrically conductive surface region at the first surface to penetrate the solid electrically conductive surface region and establish an electrically conductive relationship between the protuberance and the solid electrically conductive surface region when the surfaces are brought together, the path of penetration of the vertex extending in a direction perpendicular to the solid electrically conductive surface region at the first surface.

15. The enclosure as recited in claim 14 wherein said protuberance has a conical shape.

16. The enclosure according to claim 15 wherein the vertex is spaced between 0.005 and 0.015 inches, inclusive, from the surface of the wall.

17. The enclosure of claim 14 wherein the first surface is an electrically non-conductive surface and the second surface is an electrically conductive surface.

* * * * *